United States Patent
Huang et al.

(10) Patent No.: US 10,624,233 B1
(45) Date of Patent: Apr. 14, 2020

(54) CONFIGURABLE AIR BAFFLE

(71) Applicant: Dell Products L.P., Round Rock, TX (US)

(72) Inventors: Chin-An Huang, New Taipei (TW); Chen-Fa Wu, Tao-Yuan (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/220,347

(22) Filed: Dec. 14, 2018

(51) Int. Cl.
*H05K 7/20* (2006.01)

(52) U.S. Cl.
CPC ..... *H05K 7/20145* (2013.01); *H05K 7/20554* (2013.01); *H05K 7/20718* (2013.01)

(58) Field of Classification Search
None
See application file for complete search history.

(56) References Cited

U.S. PATENT DOCUMENTS

| | | | | |
|---|---|---|---|---|
| 6,721,180 B2* | 4/2004 | Le | ............... | H05K 7/20727 165/121 |
| 7,120,018 B2* | 10/2006 | Shen | ............... | G06F 1/20 361/695 |
| 7,345,873 B2* | 3/2008 | Dey | ............... | G06F 1/20 361/691 |
| 7,474,528 B1* | 1/2009 | Olesiewicz | ............... | H05K 7/20154 361/694 |
| 9,572,289 B2* | 2/2017 | Chang | ............... | H05K 7/1497 |
| 2013/0094140 A1* | 4/2013 | Yen | ............... | G06F 1/20 361/679.48 |
| 2013/0249740 A1* | 9/2013 | Shedletsky | ............... | H01Q 1/38 343/700 MS |
| 2017/0127562 A1* | 5/2017 | Huang | ............... | G06F 1/20 |

* cited by examiner

*Primary Examiner* — Courtney L Smith
(74) *Attorney, Agent, or Firm* — Jackson Walker L.L.P.

(57) ABSTRACT

An air baffle may include a body portion having a length and a height, as well as a plurality of folding lines arranged along the length of the air baffle. The folding lines may be substantially parallel to one another and directed along a direction of the height of the body portion. The air baffle may also include mounting features for mounting to a chassis of an information handling system. Based on a configuration of the plurality of folding lines, the air baffle may be mountable in a chassis of an information handling system to direct airflow within the chassis.

20 Claims, 6 Drawing Sheets

CONFIGURABLE AIR BAFFLE

TECHNICAL FIELD

The present disclosure relates in general to information handling systems, and more particularly to air baffles for directing cooling airflow in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM), and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, heatsinks and/or air movers (e.g., cooling fans and blowers) have often been used in information handling systems to cool information handling systems and their components.

One challenge that may arise in the cooling context is the efficient distribution of airflow. Baffles are sometimes used to direct the air flow that air movers generate to concentrate air flow at those components requiring the most cooling. Baffles may also be used to prevent leakage of airflow via undesired pathways.

Typically, however, the shape and design of a baffle is tightly coupled to the design of the chassis in which it is to be installed. Indeed, the baffle shape may even be dependent on configuration details such as what components are installed within the chassis, as different components have different sizes, shapes, and cooling requirements. Thus logistical and assembly complexity may arise, in that many different types of baffles must be designed, constructed, stocked, and installed.

This disclosure provides techniques for reducing such complexity. In some embodiments, an airflow baffle according to the present disclosure may be configurable to account for different needs. Thus a particular baffle design may be used in many different circumstances, reducing the logistical complexity. Further, such a baffle design may be used in multiple places within a single chassis, even if the requirements differ among such places.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with cooling of information handling systems and information handling resources may be reduced or eliminated.

In accordance with embodiments of the present disclosure, an air baffle may include a body portion having a length and a height. The air baffle may further include a plurality of folding lines arranged along the length of the air baffle, wherein the plurality of folding lines are substantially parallel to one another and directed along a direction of the height of the body portion. The air baffle may further include a plurality of mounting features. Based on a configuration of the plurality of folding lines, the air baffle may be mountable via the plurality of mounting features in a chassis of an information handling system to direct airflow within the chassis.

In accordance with these and other embodiments of the present disclosure, an information handling system may include a chassis, a processor disposed within the chassis, a memory coupled to the processor, and a cooling subsystem including at least one air mover and at least one air baffle within the chassis. The air baffle may include a body portion having a length and a height and a plurality of folding lines arranged along the length of the air baffle, wherein the plurality of folding lines are substantially parallel to one another and are directed along a direction of the height of the body portion. The air baffle may further include a plurality of mounting features. The air baffle may be mounted in the chassis via the plurality of mounting features and based on a configuration of the plurality of folding lines and may be operable to direct airflow within the chassis.

In accordance with these and other embodiments of the present disclosure, a method may include attaching an air baffle to a chassis of an information handling system, wherein the air baffle includes a body portion having a length and a height and a plurality of folding lines arranged along the length of the air baffle, wherein the plurality of folding lines are substantially parallel to one another and are directed along a direction of the height of the body portion. The air baffle may further include a plurality of mounting features. The air baffle may be mounted in the chassis based on a configuration of the plurality of folding lines. The method may further include causing the air baffle to direct airflow within the chassis.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4E, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

For the purposes of this disclosure, the term "management controller" may broadly refer to an information handling system that provides management functionality (typically out-of-band management functionality) to one or more other information handling systems. In some embodiments, a management controller may be (or may be an integral part of) a baseboard management controller (BMC), a chassis management controller (CMC), or a remote access controller (e.g., a Dell Remote Access Controller or Integrated Dell Remote Access Controller).

Figure 1:
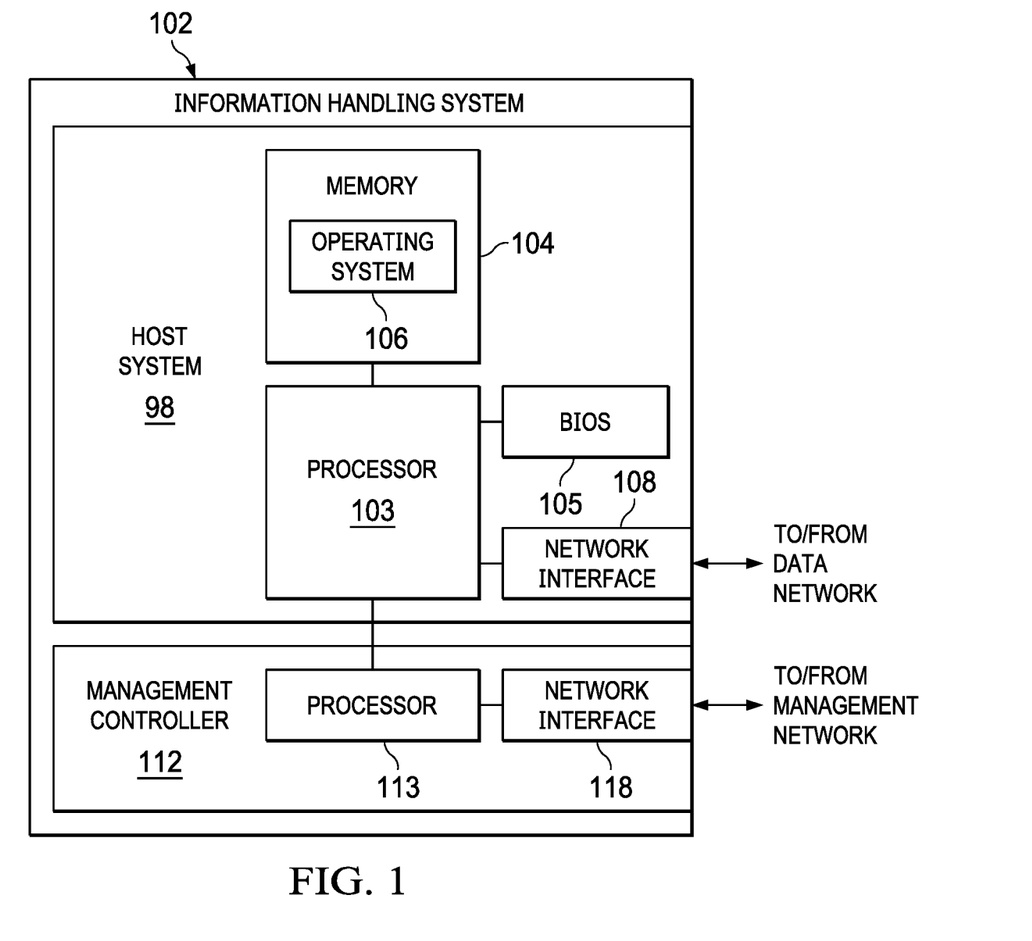
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a Basic Input/Output System (BIOS) 105 (e.g., a Unified Extensible Firmware Interface (UEFI) BIOS) communicatively coupled to processor 103, a network interface 108 communicatively coupled to processor 103, and a management controller 112 communicatively coupled to processor 103.

In operation, processor 103, memory 104, BIOS 105, and network interface 108 may comprise at least a portion of a host system 98 of information handling system 102. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Management controller 112 may be configured to provide management functionality for the management of information handling system 102. Such management may be made by management controller 112 even if information handling system 102 and/or host system 98 are powered off or powered to a standby state. Management controller 112 may include a processor 113, memory, and a network interface 118 separate from and physically isolated from network interface 108.

As shown in FIG. 1, processor 113 of management controller 112 may be communicatively coupled to processor 103. Such coupling may be via a Universal Serial Bus (USB), System Management Bus (SMBus), and/or one or more other communications channels.

Network interface 118 may be coupled to a management network, which may be separate from and physically isolated from the data network as shown. Network interface 118 of management controller 112 may comprise any suitable system, apparatus, or device operable to serve as an interface between management controller 112 and one or more other information handling systems via an out-of-band management network. Network interface 118 may enable management controller 112 to communicate using any suitable transmission protocol and/or standard. In these and other embodiments, network interface 118 may comprise a network interface card, or "NIC." Network interface 118 may be the same type of device as network interface 108, or in other embodiments it may be a device of a different type.

Figure 2:
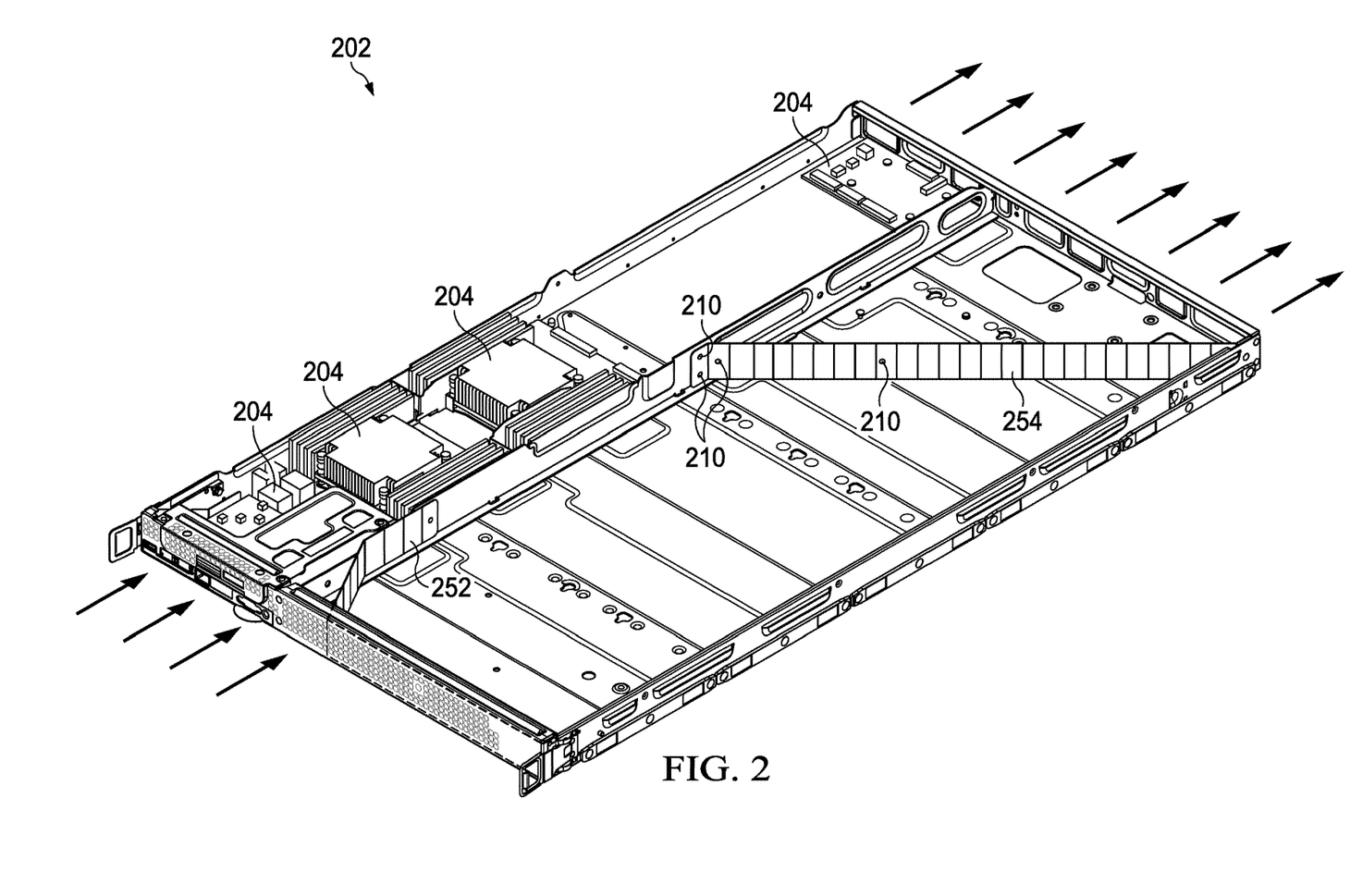
FIG. 2 illustrates a perspective view of an example information handling system with air baffles installed, in accordance with embodiments of the present disclosure.

Turning now to FIG. 2, information handling system 202 is shown. Information handling system 202 may be an example of a physical embodiment of information handling system 102, including various information handling resources 204. Air movers (not shown explicitly) may generate airflow to cool one or more of information handling resources 204, as well as information handling system 202 in general.

As shown, information handling system 202 is contained within a chassis such that airflow proceeds in the direction indicated by arrows. In the configuration shown, one side of the chassis does not contain any information handling resources that need cooling, and so it may be advantageous to direct all of the available airflow away from that region to increase airflow in the more temperature-critical regions. Accordingly, air baffle 252 may be used to block a portion of the front grille of the chassis to prevent airflow from going to waste by entering such region via the air inlet at the front grille.

Similarly, air baffle 254 may be used at the rear grille of the chassis to allow the airflow to expand in such a way as to use all of the available exhaust space. This may reduce backpressure, increasing airflow velocity and overall cooling efficiency. Thus in these embodiments, air baffles may be placed proximate to an air inlet and/or exhaust. For purposes of this disclosure, this term is defined to mean that at least a portion of the air baffle is within 1 centimeter of such air inlet or exhaust, respectively.

Further, in some embodiments, air baffles 252 and 254 may be placed such that internal leakage paths are reduced or eliminated.

Figures 4A, 4B:
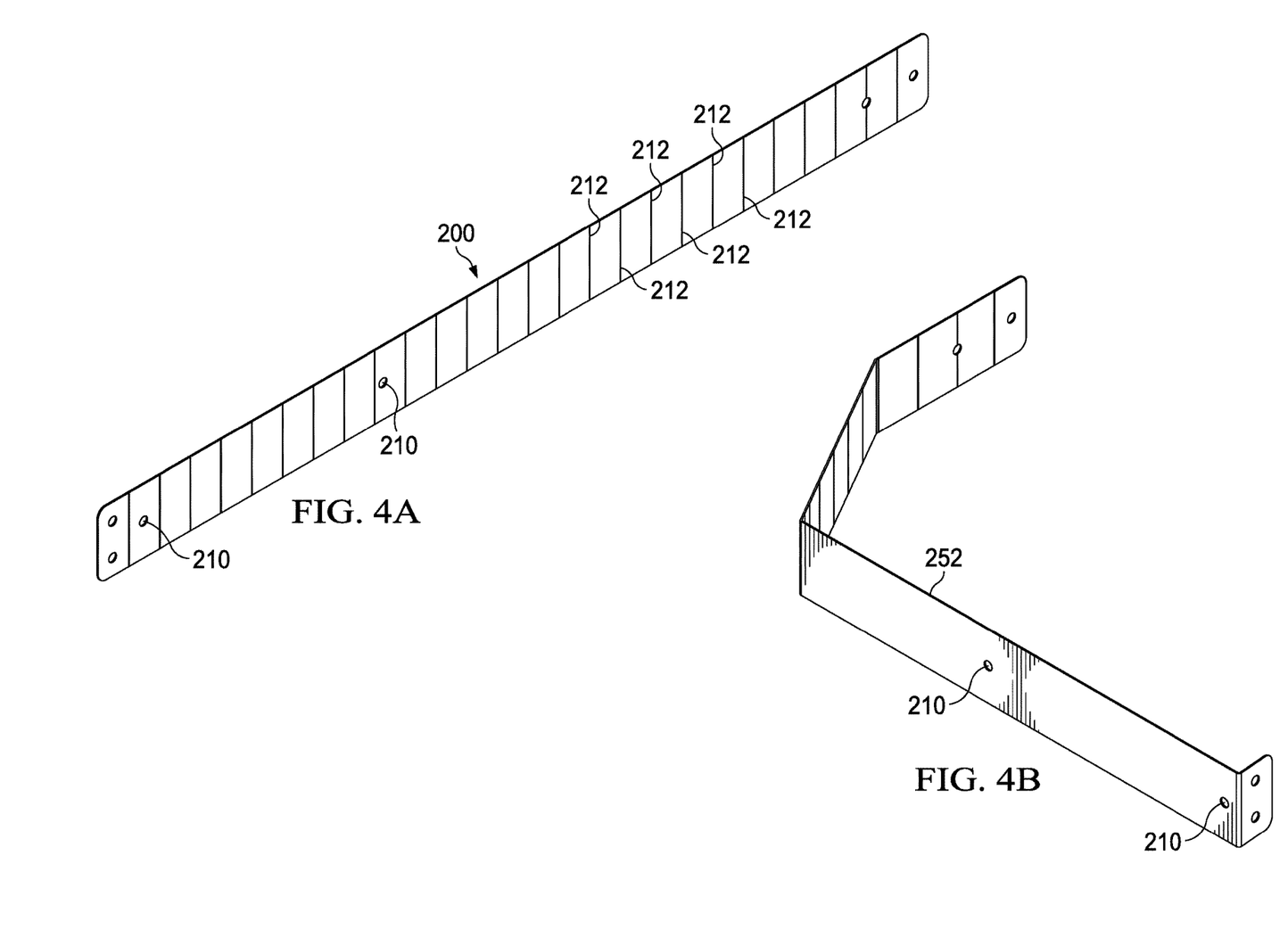
FIG. 4A illustrates an example air baffle, in accordance with embodiments of the present disclosure.
FIGS. 4B and 4C illustrate detail views of the air baffles shown in FIG. 2, in accordance with embodiments of the present disclosure.
Figure 4C:
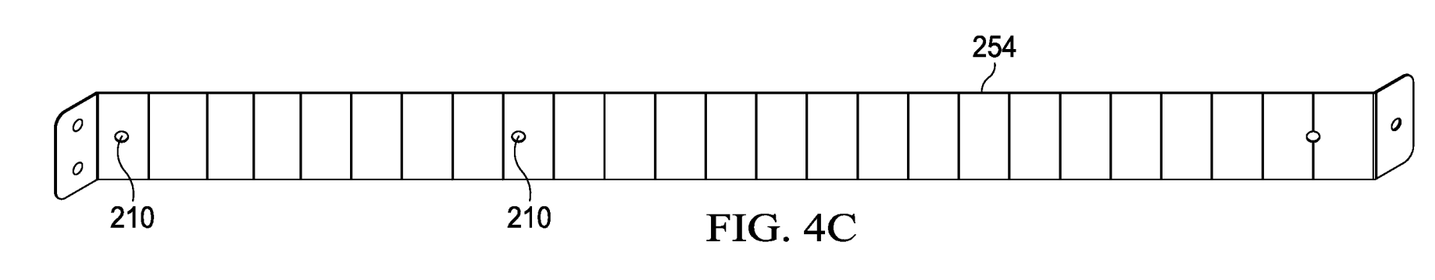

Turning briefly to FIG. 4, FIGS. 4B and 4C provide detail views of air baffles 252 and 254, respectively. These detail views illustrate how air baffles 252 and 254 are folded into the desired shapes shown in FIG. 2. Similarly, FIG. 4A provides a detail view of air baffle 200, which is an air baffle of the same design, but which has not been folded.

Air baffles 252 and 254 may in some embodiments be identical in design and construction. In some embodiments, they may be made of a BoPET (Mylar®) material, metals, plastics, or any other suitable material (either alone or in combination). As shown, a plurality of folding lines 212 may be included to allow air baffles 252 and 254 to be folded into a desired configuration. Folding lines 212 may in some embodiments be implemented as a portion of the air baffle that is made from the same material, but a thinner version, such that the air baffle may more easily be folded at those locations.

In some embodiments, these folding lines 212 may be arranged at regular intervals with a constant spacing (such as 10 millimeters, or any other suitable spacing). In other embodiments, the spacing between the folding lines 212 need not be constant. In yet other embodiments, an air baffle according to the present disclosure may include only a single folding line 212.

In the embodiment shown in FIG. 2, folding lines 212 may be parallel or substantially parallel to one another, and they may be directed along a direction of the height of air baffles 252 and 254. (For purposes of this disclosure, the term "substantially parallel" is defined to mean that elements are within five degrees of being parallel.) In other embodiments, the folding lines may be disposed in other arrangements to create air baffles that are foldable into other shapes. One of ordinary skill with the benefit of this disclosure will be able to envision many possibilities for the locations of folding lines 212.

Air baffles 252 and 254 may be folded at any or all of the folding lines, to form any desired angle(s). Thus air baffles 252 and 254 may be very adaptable in terms of the chassis designs and configurations they support.

The detail views of FIG. 4 also highlight the use of tool-less mounting features 210.

Air baffles 252 and 254 may include such tool-less mounting features 210 to support effortless mounting in various locations and in various types of chassis configurations. For example, a hole may be used as a tool-less mounting feature 210, and a stud may be pressed through such a hole and into a corresponding feature of a chassis wall or other chassis feature to secure an air baffle in place. In other embodiments, different types of mounting solutions may be used, with or without the use of tools. One of ordinary skill in the art with the benefit of this disclosure will understand many possibilities for mounting air baffles into a chassis.

Figure 3:
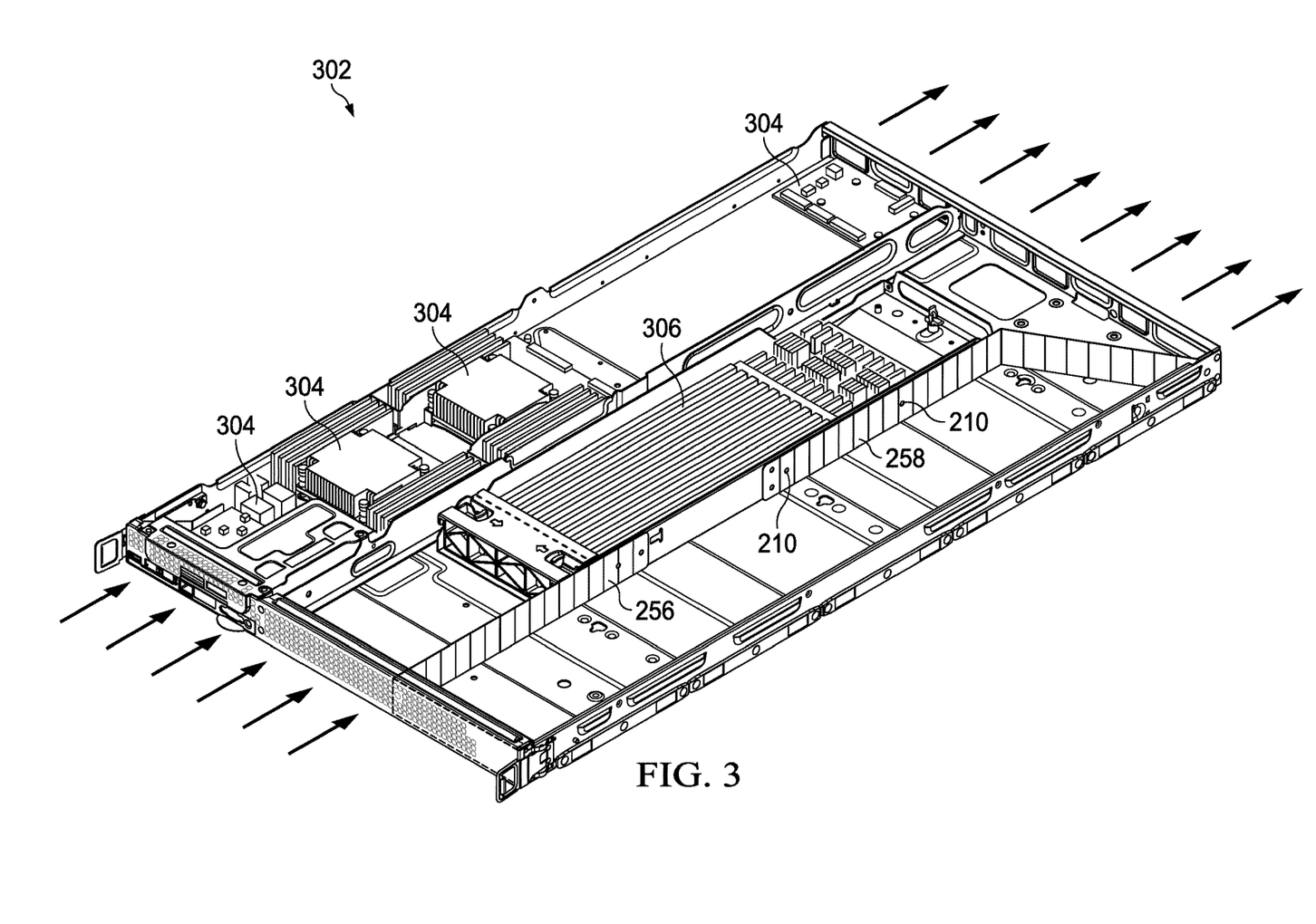
FIG. 3 illustrates a perspective view of another example information handling system with air baffles installed, in accordance with embodiments of the present disclosure.

Turning now to FIG. 3, another example information handling system 302 is shown. Information handling system 302 may be generally similar to information handling system 202, with information handling resources 304 corresponding to information handling resources 204. Accordingly, for the sake of brevity, only the differences will be described in detail.

The main difference in information handling system 302 is the addition of information handling resource 306. This addition creates the need for a different cooling solution, as compared with information handling system 202.

Accordingly, air baffle 256 has taken the place of air baffle 252. Air baffle 256 is configured to block a smaller portion of the front grille of the chassis. Similarly, air baffle 258 has taken the place of air baffle 254. Air baffle 258 has been folded in such a way that it allows for cooling of information handling resource 306, but also causes the airflow to expand to use all available exhaust space.

Figure 4D:
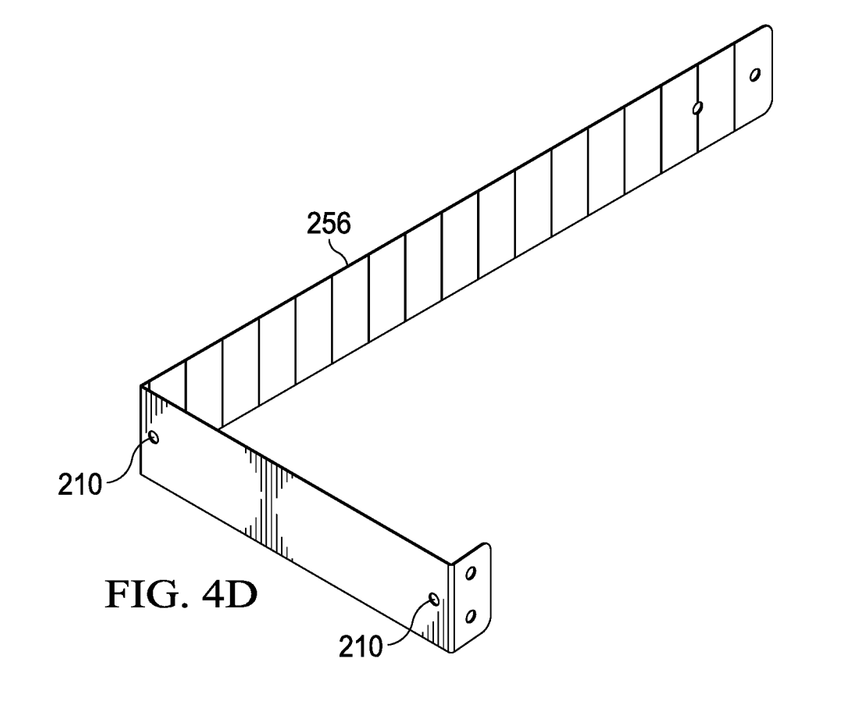
FIGS. 4D and 4E illustrate detail views of the air baffles shown in FIG. 3, in accordance with embodiments of the present disclosure.
Figure 4E:
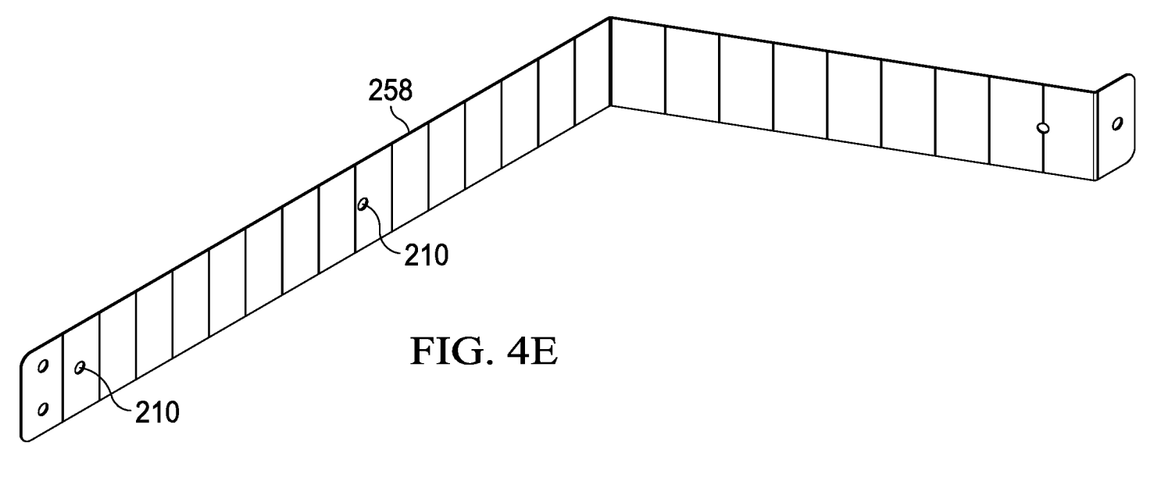

FIGS. 4D and 4E provide detail views of air baffles 256 and 258, respectively. These detail views illustrate how air baffles 256 and 258 are folded into the desired shapes that are shown in FIG. 3.

As noted above, air baffles 200, 252, 254, 256, and 258 may all be identical in design and construction. The existence of folding lines 212 allows this single design to be used in different circumstances by allowing the air baffles to be folded as needed.

In some embodiments, an air baffle according to the present disclosure may be reusable. For example, an air baffle may be removed from a particular chassis, folded into a different shape, and then re-mounted in a different chassis (or a different location within the same chassis).

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An air baffle comprising:
   a single body portion having a length and a height, wherein the single body portion includes formed therein a plurality of substantially parallel folding lines arranged along the length of the air baffle, wherein the plurality of substantially parallel folding lines extend the height of the single body portion, thereby defining a plurality of substantially rectangular baffle sections including a first substantially rectangular baffle section, and wherein a thickness of the plurality of substantially parallel folding lines is less than a thickness of a remainder of the single body portion; and
   a plurality of mounting features, wherein at least one of the plurality of mounting features is a hole disposed in an interior of the first substantially rectangular baffle section, wherein the hole extends through the thickness of the first substantially rectangular baffle section, the hole being operable to receive a stud in a chassis wall to maintain the first substantially rectangular baffle section against the chassis wall;
   wherein, based on a configuration of the plurality of substantially parallel folding lines, the air baffle is mountable via the plurality of mounting features in a chassis of an information handling system to direct airflow within the chassis.

2. The air baffle of claim 1, wherein the plurality of mounting features includes at least one tool-less mounting feature.

3. The air baffle of claim 2, wherein the first substantially rectangular baffle section is an end baffle section at an end of the air baffle and wherein the end baffle section includes two holes includes a first hole and a second hole.

4. The air baffle of claim 1, wherein the air baffle is removable from the chassis and re-mountable in a different position within the chassis based on a different configuration of the plurality of substantially parallel folding lines.

5. The air baffle of claim 1, wherein the air baffle is removable from the chassis and re-mountable in a different chassis based on a different configuration of the plurality of substantially parallel folding lines.

6. The air baffle of claim 1, wherein, when mounted in the chassis, the air baffle is configured to direct the airflow toward a particular information handling resource.

7. The air baffle of claim 1, wherein, when mounted in the chassis, the air baffle is configured to restrict airflow proximate to an air inlet of the chassis.

8. The air baffle of claim 1, wherein, when mounted in the chassis, the air baffle is configured to expand airflow proximate to an air exhaust of the chassis.

9. The air baffle of claim 1, wherein the plurality of substantially parallel folding lines are arranged at regular intervals along the length of the air baffle.

10. An information handling system comprising:
a chassis;
a processor disposed within the chassis;
a memory coupled to the processor; and
a cooling subsystem including at least one air mover and at least one air baffle within the chassis, the at least one air baffle including:
  a single body portion having a length and a height, wherein the single body portion includes formed therein a plurality of substantially parallel folding lines arranged along the length of the air baffle, wherein the plurality of substantially parallel folding lines extend the height of the single body portion, thereby defining a plurality of substantially rectangular baffle sections including a first substantially rectangular baffle section, and wherein a thickness of the plurality of substantially parallel folding lines is less than a thickness of a remainder of the single body portion; and
  a plurality of mounting features, wherein at least one of the plurality of mounting features is a hole disposed in an interior of the first substantially rectangular baffle section, wherein the hole extends through the thickness of the first substantially rectangular baffle section, the hole being operable to receive a stud in a chassis wall to maintain the first substantially rectangular baffle section against the chassis wall;
  wherein the air baffle is mounted in the chassis via the plurality of mounting features and based on a configuration of the plurality of substantially parallel folding lines, the air baffle being operable to direct airflow within the chassis.

11. The information handling system of claim 10, wherein the plurality of mounting features includes at least one tool-less mounting feature.

12. The information handling system of claim 11, wherein the first substantially rectangular baffle section is an end baffle section at an end of the air baffle and wherein the end baffle section includes two holes includes a first hole and a second hole.

13. The information handling system of claim 10, wherein the air baffle is removable from the chassis and re-mountable in a different position within the chassis based on a different configuration of the plurality of substantially parallel folding lines.

14. The information handling system of claim 10, wherein the air baffle is removable from the chassis and re-mountable in a different chassis based on a different configuration of the plurality of substantially parallel folding lines.

15. The information handling system of claim 10, wherein, when mounted in the chassis, the air baffle is configured to direct the airflow toward a particular information handling resource.

16. The information handling system of claim 10, wherein, when mounted in the chassis, the air baffle is configured to restrict airflow proximate to an air inlet of the chassis.

17. The information handling system of claim 10, wherein, when mounted in the chassis, the air baffle is configured to expand airflow proximate to an air exhaust of the chassis.

18. The information handling system of claim 10, wherein the plurality of substantially parallel folding lines are arranged at regular intervals along the length of the air baffle.

19. A method comprising:
attaching an air baffle to a chassis of an information handling system, wherein the air baffle includes:
  a single body portion having a length and a height, wherein the single body portion includes formed therein a plurality of substantially parallel folding lines arranged along the length of the air baffle, wherein the plurality of substantially parallel folding lines extend the height of the single body portion, thereby defining a plurality of substantially rectangular baffle sections including a first substantially rectangular baffle section, and wherein a thickness of the plurality of substantially parallel folding lines is less than a thickness of a remainder of the single body portion; and
  a plurality of mounting features, wherein at least one of the plurality of mounting features is a hole disposed in an interior of the first substantially rectangular baffle section, wherein the hole extends through the thickness of the first substantially rectangular baffle section, the hole being operable to receive a stud in a chassis wall to maintain the first substantially rectangular baffle section against the chassis wall;
  wherein the air baffle is attached to the chassis via the plurality of mounting features based on a configuration of the plurality of substantially parallel folding lines; and
causing the air baffle to direct airflow within the chassis.

20. The method of claim 19, further comprising:
prior to attaching the air baffle to the chassis of the information handling system, forming the air baffle into a selected shape by adjusting a configuration of at least some of the plurality of substantially parallel folding lines.

* * * * *